United States Patent
Müller-Weinfurtner et al.

(10) Patent No.: US 8,929,488 B2
(45) Date of Patent: Jan. 6, 2015

(54) TECHNIQUE FOR PROCESSING ENCODED INFORMATION IN A WIRELESS COMMUNICATION NETWORK

(75) Inventors: Stefan Müller-Weinfurtner, Nürnberg (DE); Toni Brkic, Staffanstorp (SE); Udo Wachsmann, Schwabach (DE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 74 days.

(21) Appl. No.: 13/695,982

(22) PCT Filed: May 6, 2010

(86) PCT No.: PCT/EP2010/002796
§ 371 (c)(1),
(2), (4) Date: Nov. 28, 2012

(87) PCT Pub. No.: WO2011/137918
PCT Pub. Date: Nov. 10, 2011

(65) Prior Publication Data
US 2013/0107993 A1    May 2, 2013

(51) Int. Cl.
*H04L 27/06*    (2006.01)
(Continued)

(52) U.S. Cl.
CPC ......... *H04L 1/0054* (2013.01); *H03M 13/2933* (2013.01); *H03M 13/3738* (2013.01);
(Continued)

(58) Field of Classification Search
CPC ............... H03M 13/1128; H03M 13/2975; H03M 13/3738; H03M 13/2951; H03M 313/3753; H03M 13/6525; H03M 13/413; H03M 13/4138; H03M 13/3938; H04L 1/0051; H04L 2201/06; H04L 1/0054; H04M 13/6511

USPC ......................................... 375/262, 265, 341
See application file for complete search history.

(56) References Cited

U.S. PATENT DOCUMENTS 6,879,267 B2 * 4/2005 Yamazaki ..................... 341/64
7,251,770 B2 * 7/2007 Bottomley et al. .......... 714/755
(Continued)

FOREIGN PATENT DOCUMENTS

| EP | 0866589 A1 | 9/1998 |
|---|---|---|
| EP | 1517451 A1 | 3/2005 |
| EP | 1928094 A1 | 6/2008 |

OTHER PUBLICATIONS

Jelena Nikolic-Popovic. "Using TMS320C6416 Coprocessors: Viterbi Coprocessor (VCP)." Texas Instruments Application Report SPRA750D, [online] Sep. 30, 2003, pp. 1-24, XP002591629, [retrieved on Jul. 9, 2010]. Retrieved from the Internet: <URL:http://focus.ti.com.cn/cn/lit/an/spra750d/spra750d.pdf>.
(Continued)

*Primary Examiner* — Sophia Vlahos
(74) *Attorney, Agent, or Firm* — Coats & Bennett, P.L.L.C.

(57) ABSTRACT

A technique for processing information in a wireless communication network is described. In a method in accordance with the technique, a signal encoded with a convolution code is received. The encoded signal comprises information and a check value. The encoded signal is decoded using a Viterbi algorithm to derive the information and the check value. The decoding includes computing a Viterbi state metric. A reliability parameter is then determined based on the Viterbi state metric. The information is selectively processed depending on both the check value and the reliability parameter.

15 Claims, 5 Drawing Sheets

(51) Int. Cl.
　　　H04L 1/00　　　(2006.01)
　　　H03M 13/29　　(2006.01)
　　　H03M 13/37　　(2006.01)
　　　H03M 13/41　　(2006.01)
　　　H03M 13/00　　(2006.01)
　　　H03M 13/09　　(2006.01)
　　　H03M 13/23　　(2006.01)
(52) U.S. Cl.
　　　CPC ....... *H03M 13/413* (2013.01); *H03M 13/4169* (2013.01); *H03M 13/6525* (2013.01); *H03M 13/09* (2013.01); *H03M 13/23* (2013.01)
　　　USPC .......................... 375/341; 375/262; 375/265

(56) References Cited

U.S. PATENT DOCUMENTS

| 7,912,028 | B2 * | 3/2011 | Arviv et al. ................... 370/342 |
| 8,341,486 | B2 * | 12/2012 | Rault et al. .................... 714/752 |
| 2009/0106637 | A1 | 4/2009 | Kim et al. |

OTHER PUBLICATIONS

Huang, Fu-hua. "Evaluaion of Soft Output Decoding for Turbo Codes." [online] May 29, 1997, pp. 38-56, XP002591630, [retrieved on Jul. 12, 2010] retrieved from the Internet: <URL:http//scholar.lib.vt.edu/theses/available/etd-71897-15815/unrestricted/chap4.pdf>.

Min et al. "Research on An-Based Decode of Tail-Biting Convolutional Codes and Their Performance Analyses Used in LTE System." 2009 International Forum on Information Technology and Applications, May 15, 2009, pp. 303-306, XP031525040, IEEE, Piscataway, NJ, USA.

Berrou et al. "A Low Complexity Soft-Output Viterbi Decoder Architecture." Proceedings of the International Conference on Communications (ICC), Geneva, May 23-26, 1993, pp. 737-740, XP010137075, IEEE, New York, USA.

Benthin et al. Viterbi Decoding of Convolutional Codes with Reliability Information for a Noncoherent RAKE-Receiver in a CDMA-Environment. Proceedings of the Global Telecommunications Conference, San Francisco, Nov. 28-Dec. 2, 1994, pp. 1758-1762, XP000488826, IEEE, New York, USA.

3rd Generation Partnership Project. "Technical Specification Group Radio Access Network; Evolved Universal Terrestrial Radio Access (E-UTRA); Physical Channels and Modulation (Release 9)." 3GPP TS 36.211 V8.9.0, Dec. 2012, Sophia-Antipolis, Valbonne, France.

3rd Generation Partnership Project. "Technical Specification Group Radio Access Network; Evolved Universal Terrestrial Radio Access (E-UTRA); Multiplexing and channel coding (Release 8)." 3GPP TS 36.212 V8.8.0, Dec. 2009, Sophia-Antipolis, Valbonne, France.

3rd Generation Partnership Project. "Technical Specification Group Radio Access Network; Evolved Universal Terrestrial Radio Access (E-UTRA); Physical layer procedures (Release 8)." 3GPP TS 36.213, Sep. 2009, Sophia-Antipolis, Valbonne, France.

3rd Generation Partnership Project. "Technical Specification Group Radio Access Network; Evolved Universal Terrestrial Radio Access (E-UTRA); User Equipment (UE) radio access capabilities (Release 8)." 3GPP TS 36.306 V8.6.0, Mar. 2010, Sophia-Antipolis, Valbonne, France.

3rd Generation Partnership Project. "Technical Specification Group Radio Access Network; Evolved Universal Terrestrial Radio Access (E-UTRA) and Evolved Universal Terrestrial Radio Acdess Network (E-UTRAN); Overall description; Stage 2 (Release 8)." 3GPP TS 36.300 V8.12.0, Mar. 2010, Sophia-Antipolis, Valbonne, France.

3rd Generation Partnership Project. "Technical Specification Group Radio Access Network; Multiplexing and chennel coding (FDD) (Release 6)." 3GPP TS 25.212 V6.10.0, Dec. 2006, Sophia-Antipolis, Valbonne, France.

3rd Generation Partnership Project. "Universal Mobile Telecommunications System (UMTS); Multiplexing and channel coding (FDD) (3GPP TS 25.212 version 6.6.0 Release 6)." 3GPP ETSI TS 125 212 V6.6.0 Sep. 2005, Sophia-Antipolis, Cedex, France.

* cited by examiner

TECHNIQUE FOR PROCESSING ENCODED INFORMATION IN A WIRELESS COMMUNICATION NETWORK

TECHNICAL FIELD

The present invention relates to processing of encoded information. Particularly, the invention relates to a technique for selectively processing convolutionally encoded information in a wireless communication network based on decoding-reliability information.

BACKGROUND

In communication networks, particularly wireless networks, information is typically exchanged in transport blocks error-protected by a convolutional code, i.e., as code blocks. A receiver locates the code block in a received signal and Viterbi decoding is performed to retrieve the transport block.

Mobile communication standards, including the Long-Term Evolution (LTE, also known as Evolved Universal Terrestrial Radio Access, E-UTRA) and Universal Mobile Telecommunications System (UMTS) standards of 3GPP, convey control information to a User Equipment (UE) in transport blocks, which further comprise a Cyclic Redundancy Check (CRC) value of the control information for error detection. The UE has to completely decode the received signal before validating the control information in the transport block based on the CRC value. In case of a negative CRC, the control information will be discarded, i.e. computation time and power for the decoding has been wasted. This waste is particularly unfavourable for a battery-operated mobile receiver with limited computational and power resources.

The resource demands for decoding are particularly high for modern tail-biting convolutional codes having significantly increased decoding complexity. Moreover, for cellular networks addressing the UE by an identifier included in the transport block, the UE has to decode a large number of code blocks in order to identify the transport block actually addressed to the UE.

As stated above, a decision whether to process or discard the control information is conventionally based on the CRC value. Because of the finite number of bits reserved for the CRC value, there is a small but non-negligible probability of erroneously identifying control information as addressed to the UE or even noise signals as valid information, typically in the order of $10^{-4}$. Since content of the incorrect control information is close to random, processing the incorrect control information can lead to undefined receiver states and can cause further traffic of retransmission requests. For example, network throughput of useful data can be reduced, radio and computational resources may be wasted, a processing stage may enter an undefined state, and a communication partner may have to process positive or negative acknowledgements for transport blocks that were never sent.

SUMMARY

It is an object of the present invention to provide a method and a device for more effectively processing error-prone information in mobile communication networks.

According to a first aspect, a method of processing information in a wireless communication network is provided. The method comprises the steps of receiving a signal encoded with a convolutional code and (at least partially) decoding the encoded signal using a Viterbi algorithm. The encoded signal comprises information and a check value. The information and the check value are derived using the Viterbi algorithm. The decoding includes (or can be limited to) computing a Viterbi state metric. The method further comprises the steps of deriving a reliability parameter and a reference value, and selectively processing the information depending on the check value, the reliability parameter, and the reference value. The reliability parameter is based on the Viterbi state metric. The reference value is based on the (received) signal.

Deriving the reliability parameter based on the Viterbi state metric can be implemented with minor additional computational complexity, since the Viterbi state metric may be a by-product of the Viterbi algorithm. The reference value may account for or compensate for absolute fluctuation (such as signal power). The reliability parameter may provide an additional criterion for a selective processing following the decoding, which can significantly reduce a probability rate for processing incorrect information. Computational power associated with a validation based on the check value can be saved if the reliability parameter (considered prior to the check value) indicates incorrect information. Computational complexity associated with the decoding can be reduced by interrupting the decoding, wherein the reliability parameter is based on the Viterbi state metric of a partial Viterbi path. Particularly, using the Viterbi algorithm to derive the information and the check value may encompass interrupting the Viterbi algorithm prior to completely deriving the information and the check value.

The selective processing of the information may comprise discarding the information if the reliability parameter fails to fulfil a predefined reliability criterion. The reliability criterion can be a threshold value. Identifying "false alarms" and/or discarding information (of false alarms) can prevent a receiver from entering an undefined state and can avoid requests for retransmission, thereby increasing an effective channel throughput.

The check value can be at least one of a check sum, a hash function value, a cyclic redundancy check (CRC) value, and a user terminal identifier; or any combination thereof. The combination can be an exclusive disjunction (XOR). The check value can be indicative of at least one of a correctness of the information and an address of the receiver. Alternatively, or in addition, the encoded signal can further comprise a (separate) user terminal identifier. The information can be processed further depending on the user terminal identifier. A probability rate of processing incorrect information is thus further reducible.

The information can comprise user data, control information or any other kind of information. The control information can be downlink control information as part of a receiver specific search space. Alternatively, the downlink control information can be part of a common search space (on a downlink shared channel or a dynamic broadcast channel). Further data communication is beneficially based on (communication parameters derived from) the selectively processed control information because of its high reliability.

When deriving the reliability parameter, a channel condition of a transmission channel for the encoded signal may be further considered. Alternatively, the reliability criterion can depend on the channel condition. Channel coefficients can indicate the channel condition. In the case of channel coefficients volatile in time or frequency, the reliability parameter can be reduced or the reliability criterion can be raised.

The Viterbi state metric can be computed for a final position of the received signal. For example, the reliability parameter can depend on a maximum of the Viterbi state metric of the final position. The reliability parameter can thus be indicative of the reliability of the decoded information based on a complete Viterbi path.

In one implementation, the Viterbi state metric for the final position is computed by a single Viterbi decoding process ("non-repetitive computation"). The single Viterbi decoding process can be limited to a single updating process. Relying on a single process can save computational and power resources, particularly if the signal is encoded by a terminated convolutional code.

In another implementation, the computation of the Viterbi state metric for the final position (i.e. the decoding or updating process from initial to final position of the received signal) can be repeated ("repeated computation"). The repeated computation can be initialized based on a Viterbi state metric previously computed for the final position of the received signal. Repeating the computation can provide a lower error rate and/or higher effective data throughput, particularly if the convolutional code is a tail-biting convolutional code.

The Viterbi state metric previously computed for the final position or the initial Viterbi state metric can be stored. The reliability parameter can depend on a maximum of the difference between the Viterbi state metric of the final position in the repeated computation and the stored Viterbi state metric. Basing the reliability parameters on the difference can provide a high quality reliability measure in the case of an a priori unknown initial Viterbi state, particularly in the case of a tail-biting convolutional code. The computation may be repeated once after storing, which may require minimal computational complexity. Optionally, the computation is repeated several times after storing, which may improve a numerical significance of the reliability parameter.

A convergence condition indicating that the Viterbi state metric computed for the final position essentially represents the initial condition of the tail-biting code can trigger the storing or the deriving steps. The convergence condition can be a consistent maximum condition requiring that the state having a maximum Viterbi state metric for the final position in a previous computation equals the state having a maximum Viterbi state metric for the final position in a current computation. Alternatively or additionally, the convergence condition can be a tail-biting condition.

The non-repetitive or the repeated computation can provide the reliability parameter or a basis for deriving the reliability parameter without a trace-back process (of the Viterbi decoding). Deriving the reliability parameter without or prior to the trace-back process can avoid the computational complexity associated with the trace-back process. Particularly, the decoding of the encoded signal using the Viterbi algorithm encompasses a partial Viterbi algorithm interrupted depending on the reliability parameter prior to the trace-back process. The selectively processing depending on both the check value and the reliability parameter encompasses the case of selectively deriving the information and the check value in the trace-back process depending on the reliability parameter based on the Viterbi state metric, and, if derived, selectively processing of the information depending on the check value. The computational complexity associated with the trace-back process is thus avoidable.

Soft bits can be used to represent the received signal. The reliability parameter can be computed by a summation including the soft bits. In this case, the Viterbi state metric can be understood as the summation or a partial sum of the summation. In one variant, the summation further includes signs (determined by transitions between Viterbi states) according to the decoded signal. Particularly, the summation can further include signs determined during the trace-back process of the decoding. Deriving the reliability parameter based on the received signal (represented by the soft bits) and the decoded signal can avoid storing the Viterbi state metric in or after the step of decoding. The reliability parameter can be flexibly derived (during or after the trace-back process). The flexibility saves memory and computational resources if the reliability parameter is not required for all decoded signals. Particularly, deriving the reliability parameter can be triggered by a negative check value.

Whenever soft bits represent the received signal, a second reliability parameter can be derived as a function of the derived reliability parameter and the reference value. The reference value can be based on the soft bit representation. Particularly, the reference value may be a sum of the soft bits, preferably a sum of absolute values of the soft bits. While the derived reliability parameter can depend on a scale of the soft bit representation, the second reliability parameter can be independent of the scale of the soft bit representation. The second reliability parameter may be a homogeneous function of degree zero. Denoting any derived reliability parameter by $\Lambda_{path}^x$ and the (absolute) sum of soft bits by $\Gamma$, possible functions include at least one of the quotients $R_1 = \Lambda_{path}^x/\Gamma$, $R_2 = (\Gamma - \Lambda_{path}^x)/(2\Gamma)$ and $R_3 = (\Gamma - \Lambda_{path}^x)/(\Gamma + \Lambda_{path}^x)$, or any function thereof.

According to a further aspect, a computer program product is provided that comprises program code portions for performing the steps of any one of the methods described herein when executed by one or more computing devices. The computer program product can be stored on a computer readable recording medium.

According to a still further aspect, a device for processing information in a wireless communication network is provided. The device comprises a receiver, a decoder, and a processor. The receiver is adapted to receive a signal encoded with a convolutional code, wherein the signal comprises information and a check value. The decoder is adapted to decode the encoded signal using a Viterbi algorithm to derive the information and the check value. The decoder is adapted to compute a Viterbi state metric. The processor is further adapted to derive a reliability parameter based on the Viterbi state metric, to derive a reference value based on the (received) signal, and to selectively process the information depending on the check value, the reliability parameter, and the reference value. The decoder may be implemented on or by the processor.

The decoder can be adapted to compute the Viterbi state metric for a final position of the received signal. The processor can be further adapted to derive the reliability parameter depending on a maximum of the Viterbi state metric of the final position.

The receiver can be adapted to derive soft bits representative of the received signal. The processor can be further adapted to derive a second reliability parameter as a function of the derived reliability parameter and the reference value (which may be based of the soft bits).

BRIEF DESCRIPTION OF THE DRAWINGS

In the following, the technique presented herein will be described in more detail with reference to exemplary embodiments illustrated in the drawings, wherein.

DETAILED DESCRIPTION

In the following description, for purposes of explanation and not limitation, specific details are set forth, such as specific device configurations and specific scenarios of processing information in order to provide a thorough understanding of the technique disclosed herein. It will be apparent to one skilled in the art that the technique may be practiced in other embodiments that depart from these specific details. Moreover, while the following embodiments are primarily described in relation to the 3GPP standard Evolved Universal Terrestrial Radio Access (E-UTRA), also known as Long-Term Evolution (LTE), it will be readily apparent that the technique described herein may also be practiced in the context of other standards including UMTS W-CDMA. Furthermore, while in the following reference is made to downlink control information as defined for LTE, the technique discussed herein can also be applied to uplink control information, control information in general, and any other kind of information such as user data error-protected by a convolutional code.

Those skilled in the art will further appreciate that the methods, steps and functions explained herein may be implemented using individual hardware circuitry, using software functioning in conjunction with a programmed microprocessor or general purpose computer, using an Application Specific Integrated Circuit (ASIC) and/or using one or more Digital Signal Processors (DSPs). It will be also be appreciated that while the following embodiments are primarily described in the form of methods and devices, the technique disclosed herein may also be embodied in a computer processor and a memory coupled to the processor, wherein the memory stores one or more programs that perform the steps discussed herein when executed by the processor.

Figure 1:
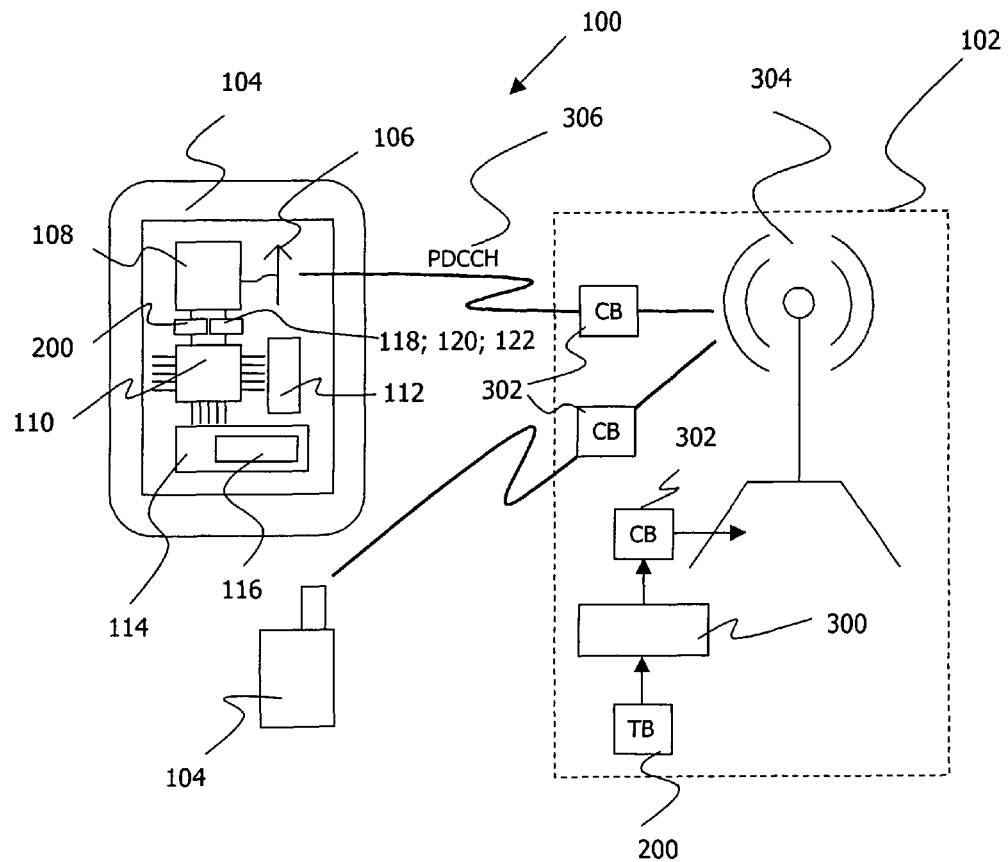
FIG. 1 schematically illustrates an embodiment of a communication network including a plurality of user terminals.

FIG. 1 schematically illustrates an embodiment of a mobile communication network 100 comprising a stationary node 102 (here a base station, such as an E-UTRAN Node B, eNB) and a plurality of (stationary and mobile) wireless user terminals 104 (also referred to as user equipment, UE). Each user terminal 104 comprises a receiver 106 coupled to a decoder 108, and a processor 110 coupled to a volatile random access memory (RAM) 112 and a non-volatile memory 114 (preferably read-only memory or flash memory). The node 102 comprises an encoder 300 adapted to transform a transport block 200 into a code block 302. The encoder 300 is coupled to a transmitter 304 adapted to send the code block 302 via a physical downlink control channel 306 to the receiver 106 of a selected one or each of the plurality of user terminals 104. The receiver 106 provides (as a received signal) a soft bit representation of the received code block 302.

The decoder 108 is implemented as a separate hardware unit in the embodiment of the user terminal 104 shown in FIG. 1. In an alternative embodiment, functionality of the decoder 108 is implemented by instructions 116 stored in the non-volatile memory 114, the instructions 116 causing the processor 110 to decode the received code block 302 to derive the transport block 200. The decoder 108 (as a separate unit) or the processor 110 is adapted to perform a Viterbi algorithm to derive the transport block 200. The decoder 108 or the processor 110 computes a Viterbi state metric A during decoding (based on the soft bit representation of the code block 302) or after decoding (based on both the soft bit representation of the code block 302 and the decoded transport block 200) and derives a reliability parameter $\Lambda_{path}$ 118 based on the Viterbi state metric $\Lambda$ and optionally a reference value $\Gamma$ denoted by 122, as will be discussed further below.

Figure 2:
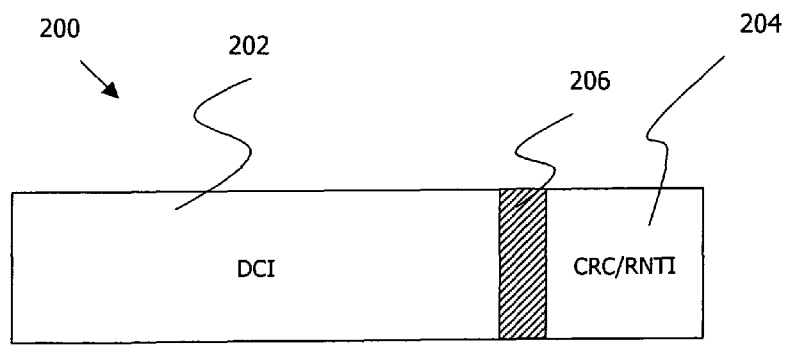
FIG. 2 schematically illustrates an embodiment of a transport block comprising information and a check value.

An exemplary embodiment of the transport block 200 is schematically illustrated in FIG. 2. The transport block comprises at low-valued bits Downlink Control Information (DCI) 202 as payload data. At high-valued bits, the transport block 200 comprises a 16-bit check value, which is a Cyclic Redundancy Check (CRC) value of the downlink control information 202. The CRC has been subjected to an exclusive disjunction with a 16-bit radio network temporary identifier (RNTI) of the user terminal 104, to which the node 102 addresses the specific transport block 200. Filler bits 206 separate the downlink control information 202 and the check value 204, so that a bit length K of the transport block fulfils a given format constraint.

Figure 3:
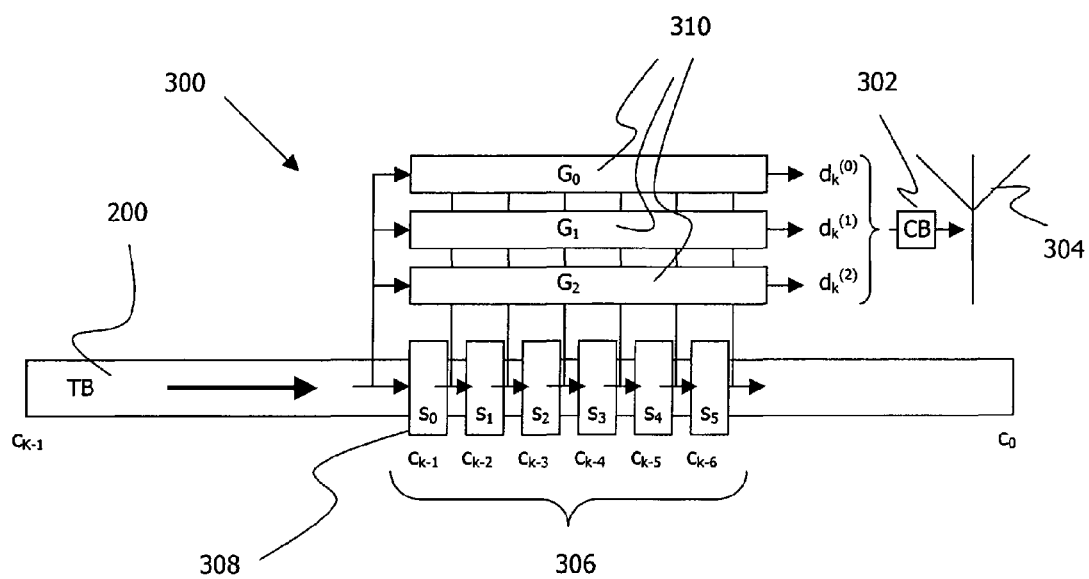
FIG. 3 schematically illustrates an embodiment of a convolutional encoder transforming the transport block to be encoded into a code block.

FIG. 3 shows a functional principle of the encoder 300 for convolutionally encoding the transport block 200 of bit length K of FIG. 2 into the code block 302 having a bit length 3K. The code block 302 is initially provided to the transmitter 304 of the node 102. The encoder comprises a shift register 306 including six cascaded flip flops $s_0, \ldots, s_5$ (reference sign 308). The input of the first flip flop $s_0$ and the outputs of all flip flops $s_0, \ldots, s_5$ are connected to three adders 310, each of which is implemented by a sequence of XOR gates and represented by generator polynomials $G_0=(1, 0, 1, 1, 0, 1, 1)$ equal to an octal representation 133, $G_1=(1, 1, 1, 1, 0, 0, 1)$ equal to the octal representation 171, and $G_2=(1, 1, 1, 0, 1, 0, 1)$ equal to an octal representation 165. Output streams $d_k^{(0)}$, $d_k^{(1)}$, and $d_k^{(2)}$ of the adders 310 are interleaved and subject to bit puncturing for rate matching, which results in the code block 302.

The encoder 300 is adapted to generate a tail-biting code, i.e. the register 306 is initialized by the values $s_i=c_{(K-1-i)}$. An encoding process comprises encoding steps from k=0 to k=K-1 with a cyclic interpretation of the indices (x) of the transport block ($c_x$). At the encoding step k, the flip flops $s_0, \ldots, s_5$ are set to the values $c_{k-1}, \ldots, c_{k-6}$ of the transport block 200.

Figure 4A:
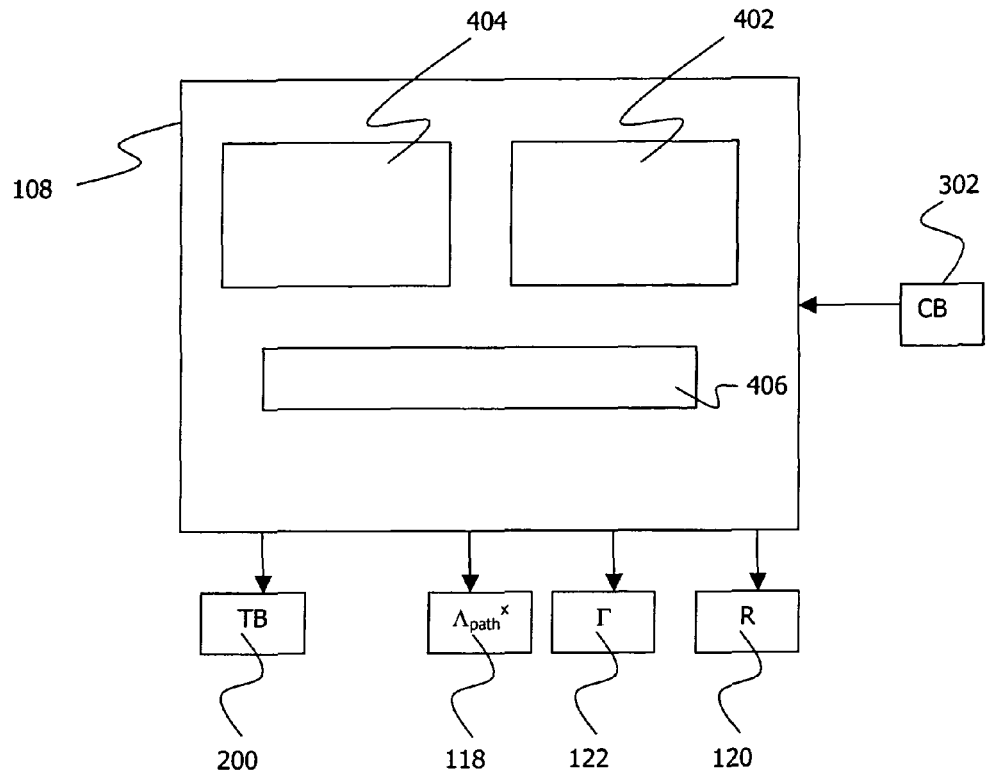
FIG. 4A schematically illustrates an embodiment of a decoder.
Figure 4B:
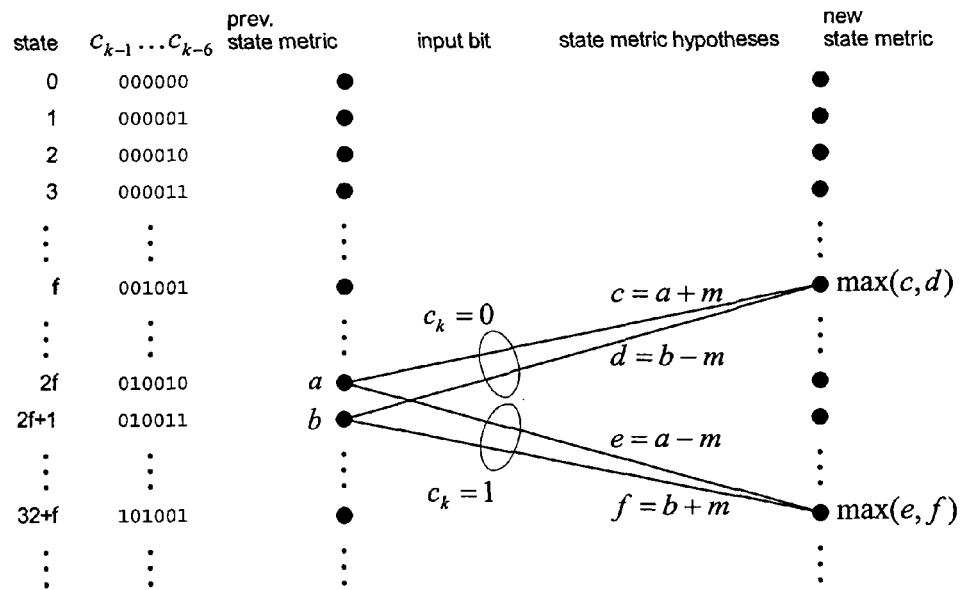
FIG. 4B schematically illustrates an embodiment of an updating step in an updating process of a Viterbi algorithm.

FIGS. 4A and 4B illustrate the decoding of the code block 302 after having been received by the user terminal 104 form the node 102 by means of a Viterbi algorithm. The decoder 108 of the user terminal 104 is illustrated in FIG. 4A to comprise a current Viterbi state metric memory 402 for an updating process of the Viterbi algorithm, an optimal incoming branch memory 404 for a trace-back process of the Viterbi algorithm, and a final Viterbi state metric memory 406 for repetitions of the Viterbi algorithm.

FIG. 4B schematically illustrates one updating step of the updating process of the Viterbi algorithm. The current state metric memory 402 stores a Viterbi state metric denoted $\Lambda_{i,k}(s)$ of (at least) the current repetition i of the Viterbi algorithm. In the case of decoding a tail-bite convolutional code, the Viterbi algorithm is repeated and the index $i=1, \ldots, n_{iteration}^{max}$ consecutively numbers the repetition of the Viterbi algorithm. The index $k=0, \ldots, K-1$ denotes the updating step index. The Viterbi state metric $\Lambda_{i,k}(s)$ assigns a value to each state s=0, . . . , 63 (according to the register length of six bits, also denoted constraint length of the convolutional code). The state metric value is a logarithm of a conditional probability for that the encoding register 306 was in the state s at the encoding step k, given the soft bit representation of the code block 302 (up to the step k).

As the bits $c_0, \ldots, c_{K-1}$ of the transport block 200 are shifted through the register 306 (on the encoder side), possible transitions (at the receiver side) are limited to so-called "butterflies" in each updating step k, as shown in FIG. 4B. A butterfly is represented by 6−1=5 bits with f=(0, 1, 0, 0, 1) being an example shown in FIG. 4B. The butterfly f represents a collection of four possible transitions from previous states 2f=(f, 0) and 2f+1=(f, 1) (having metric values "a" and "b", respectively) to new states f=(0, f) and $2^{6-1}$+f=(1, f) (having metric values to be determined in the updating step k). In the updating step k there are two hypotheses for a current input bit $c_k$ (corresponding to the encoding step k of entering either the bit $c_k$=0 or $c_k$=1 of the transport block 200 into the register 306 on the encoder side). One updating step consists of $2^{6-1}$=32 butterflies denoted by f=0, . . . , 31 and a so-called updating process (also known as iteration in "trellis") comprises K updating steps denoted by k=0, . . . , K−1.

The updating process of the Viterbi algorithm initializes the Viterbi state metric $\Lambda_{1,0}$ (s) according to an a priori probability of the states s=0, . . . , 63 before the first updating step k=0:

$$\Lambda_{0,1}(s) = \begin{cases} 0 & \text{for } 0 \leq s < \lceil 64/2^{DVIT\_num\_zero\_pad} \rceil \\ -\infty & \text{for } \lceil 64/2^{DVIT\_num\_zero\_pad} \rceil \leq s < 64 \end{cases}.$$

In the case of a tail-biting code (as is provided by the embodiment of the encoder 300 discussed above with reference to FIG. 3), all initial states are a priori equally likely at the start of the first updating process i=1. Here, a communication parameter DVIT_num_zero_pad is equal to 0, so that $\Lambda_{1,0}$ (s) represents a uniform (probability) distribution of initial states s. In the case of a terminated 6-bit code, only the state s=0 is possible at the start of the first updating process i=1. Here, the communication parameter is DVIT_num_zero_pad=6 corresponding to the constraint length of the convolutional code.

The updating process runs through the decoding trellis from the first (k=0) to the last (k=K−1) transport block bit $c_k$. It should be noted that the present technique is not limited to a convolutional code of 64 states, chosen as a numerical example of the explanatory embodiments shown in FIGS. 3 and 4. In each updating step k=0, . . . , K−1 of one particular iteration i of the updating process, the Viterbi state metric in the current state metric memory 402 is updated from the old state metric $\Lambda_{i,k}(s)$ to the new state metric $\Lambda_{i,k+1}(s)$ by adding to the old metric values (denoted "a" and "b" for the butterfly shown in FIG. 4B) a branch metric value (denoted "m" for the butterfly shown in FIG. 4B), which is proportional to a logarithm of a transition probability (also referred to as a branch metric). The transition probability is represented by the soft bit representation of the values $d_k^{(0)}$, $d_k^{(1)}$, $d_k^{(2)}$ associated with the updating step k.

There are always two incoming transition branches at each state. The state metric values are denoted "c" and "d" for the state f as well as "e" and "f" for the state 32+f in the exemplary updating step of FIG. 4B. The branch yielding the higher state metric (i.e. the state metric values max(c, d) and max(e, f), respectively) is written to the current Viterbi state metric memory 402 defining the new state metric $\Lambda_{i,k+1}(s)$. The optimal incoming branch memory 404 comprises a list of indices of the optimal incoming branch for each state s in each updating step k. The index for the optimal incoming branch of the state s in the current updating step k is set to the branch yielding the higher state metric value. In another embodiment, it may further contain the index of the start state associated with the survivor path for each state in the current updating step.

The updating process is repeated in the case of the tail-biting code, because the a priori initial condition for the Viterbi state metric $\Lambda_{1,0}(s)$ is agnostic to the initial state of the register 306 of the encoder 300 applying a cyclic initial condition (also known as tail-bite condition) with respect to the transport block 200. According to a first embodiment of the decoder 108, the updating process is performed $n_{iteration}^{max}$ times. At the end of each updating process i=1, . . . , $n_{iteration}^{max}$, the current Viterbi state metric memory 402 represents the final Viterbi state metric $\Lambda_{i,K}(s)$ for all states s=0, . . . , 63, which is copied to the final Viterbi state metric memory 406. The initial Viterbi state metric $\Lambda_{i+1,0}(s)$ for a repetition of the updating process (following the i-th updating process) is obtained by subtracting the maximum of the final Viterbi state metric at the end of the previous updating process from all other states corresponding to a wrap-around Viterbi decoding with renormalization:

$$\Lambda_{i+1,0}(s) = \begin{cases} \Lambda_{i,K}(s) - \max_{s=0,\ldots,63}(\Lambda_{i,K}(s)) & \text{for } 0 \leq s < \lceil 64/2^{DVIT\_num\_zero\_pad} \rceil \\ -\infty & \text{for } \lceil 64/2^{DVIT\_num\_zero\_pad} \rceil \leq s < 64 \end{cases}.$$

If a flag DVIT_use_stop_rule equals "1" indicating that a stopping rule is to be applied, the decoder 108 determines according to the stop rule whether the updating process is to be repeated.

The stopping rule involves a tail-biting condition in the case of tail-biting codes. Generally, a Viterbi path is uniquely indicated by a final state and the stored optimal incoming branches. A tail-biting path is required to fulfil the tail-biting condition. The tail-biting condition requires that, starting from the final state and following backwards the optimal incoming branches (as stored in the optimal incoming branch memory 404) during the trace-back process, an initial state determined by the trace-back process is identical to the final state.

Optionally, the stopping rule involves a consistent maximum condition, which requires that the state $s_{max}$ assuming the maximum state metric value of the final Viterbi state metric, $\Lambda_{i,K}(s_{max})=\max_s(\Lambda_{i,K}(s))$, is equal to the maximum state of the previous final Viterbi state metric: $\Lambda_{i-1,K}(s_{max})=\max_s \Lambda_{i-1,K}(s)$. For determining the consistent maximum condition, the decoder 108 compares the final Viterbi state metric $\Lambda_{i,K}(s)$ of the current updating process stored in the current Viterbi state metric memory 402 with the final Viterbi state metric $\Lambda_{i-1,K}(s)$ of the previous updating process stored in the final Viterbi state metric memory 406.

For the case of a terminated code (also referred to as "trellis termination"), only a single updating process (iteration i=1) is performed.

The updating process is completed, if i=$n_{iteration}^{max}$ (for tail-biting decoding), or the flag DVIT_use_stop_rule equals "1" and the stopping rule is fulfilled (also for tail-biting decoding), or the single updating process is completed (for the terminated code). Once the updating process is completed, the trace-back process of the Viterbi algorithm starts determining a "best path" based on the maximum state of the final Viterbi state metric $\Lambda_{i,K}(s)$. The best path of the recent updating process (after the iteration i) is uniquely indicated by the final Viterbi state having the maximum state metric value in the final Viterbi state metric $\Lambda_{i,K}(s)$. The explicit Viterbi path corresponding to this maximum final Viterbi state is derived by the decoder following the optimal incoming branches stored in the optimal incoming branch memory 404, starting from the final trellis (of the step k=K) backwards to the initial trellis (of the step k=0) in the trace-back process. The best path corresponds to the maximum likelihood sequence of states s, which sequence, in turn, corresponds to a decoded transport block 200. The decoded transport block 200 is output by the decoder 108.

Additionally, the decoder 108 derives a reliability parameter $\Lambda_{path}$ denoted by 118 as a quality measure of the decoded transport block 200 as a decoding result and, optionally, a reference value r denoted by 122. The reliability parameter 118 and, if derived, the reference value 122 are output to the processor 110 in case the decoder 108 is implemented as a separate unit. Three embodiments of reliability parameters 118 and corresponding approaches of deriving the embodiments of the reliability parameter 118 are described in more detail below. The decoder 108 or the processor 110 can derive one or all of these reliability parameters 118.

A first embodiment of a reliability parameter 118 denoted by $\Lambda_{path}^{state}$ is derived based on the final Viterbi state metric of the single updating process (i=1 in the case of the terminated code) or most recent updating process (i≥1 in the case of the tail-biting code). In the case of the terminated code, the first embodiment of the derived reliability parameter is the maximum of the final Viterbi state metric $\Lambda_{i,K}(s)$, i.e. the metric value associated with the final state of the best path, which is $$\Lambda_{path}^{state}=\Lambda_{1,K}(0).$$

If this maximum of the final Viterbi state metric is not consistent with the termination condition of the terminated code requiring the state s=0 to assume the maximum of the final Viterbi state metric, $\Lambda_{1,K}(0)=\max_{s=0\ldots 63}(\Lambda_{1,K}(s))$, the decoder can output an error message instead of, or in addition to, the reliability parameter $\Lambda_{path}^{state}$.

In the case of the tail-biting code, the first embodiment of the derived reliability parameter 118 is determined by searching for the best tail-biting path based on the final Viterbi state metric, which reads $$\Lambda_{path}^{state}=\max_{s\in T}(\Lambda_{i,K}(s)),$$

wherein T denotes the set of tail-biting paths, i.e. paths fulfilling the tail-biting condition. It is possible that the best state (maximizing $\Lambda_{i,K}(s)$) of the most recent update process is not identical to the best state (maximizing $\Lambda_{i-1,K}(s)$) of the previous updating process, in which case a warning message indicating insufficient convergence of the Viterbi state metric is generated.

The first embodiment of the reliability parameter 118 introduces a small error in the case of the tail-biting code, since in the updating process (as part of the decoding) the final Viterbi state metric is not exactly equal to a path metric. The error is small since the final Viterbi state metric typically converges after some repetitions of the updating process (sometimes referred to as "equilibration"). Only for an a priori known initial state, i.e., terminated convolutional codes, the final Viterbi state metric (exactly) represents the metric of the path associated by the trace-back process.

The first embodiment of the reliability parameter 118 is favourable because of its low computational requirements, since no specific initial conditions have to be considered in the computation, and since the first embodiment does not necessarily rely on repetitions of the updating process. Furthermore, the final Viterbi state metric memory 406 can be avoided. In case there are repetitions of the updating process, the initial condition for the repetition includes the renormalization by the best state of the previous final Viterbi state metric, which avoids a drift in the reliability parameter 118 according to the first embodiment.

A second embodiment of the reliability parameter 118, denoted by $\Lambda_{path}^{iterate}$, is derived computing an exact path metric corresponding to the decoded transport block 200. In more detail, the second embodiment of the reliability parameter 118 is derived by searching for the maximum of the difference between the final Viterbi state metric $\Lambda_{i,K}(s)$ of the most recent updating process and the initial Viterbi state metric $\Lambda_{i,0}(s)$ among all tail-biting paths, which reads $$\Lambda_{path}^{iterate}=\max_{s\in T}(\Lambda_{i,K}(s)-\Lambda_{i,0}(s)).$$

The initial Viterbi state metric can be stored in an initial Viterbi state metric memory or can be derived according to the initial conditions based on the final Viterbi state metric of the previous updating process stored in the final Viterbi state metric memory 406. The second embodiment of the reliability parameter 118 avoids the small error of the first embodiment. Furthermore, the second embodiment is preferred for an implementation in combination with the updating process of the Viterbi algorithm. In the preferred implementation, the decoder 108 or the processors 110 performing the updating process of the Viterbi algorithm also derives the reliability parameter 118 according to the second embodiment based on the initial and final Viterbi state metrics computed during the update process.

A third embodiment of the reliability parameter 118 also provides the exact path metric. While the second embodiment of the reliability parameter 118 is based on the initial and final Viterbi state metrics computed in the update process, the reliability parameter 118 according to the third embodiment is derived during a trace-back process (which can be the trace-back process of the Viterbi decoding or a later independent trace-back process). The reliability parameter 118 according to the third embodiment is based on the soft bit representation $d_k^{(j)(received)}$ of the received signal and expected physical bits $b_k^{(j)(re-encoded)}$ obtained by re-encoding. The expected physical bits $b_k^{(j)(re-encoded)}$ can be obtained by re-encoding the decoded transport block 200 or by re-encoding along the Viterbi path (determined according to the stopping rule and the maximum of the final metric state), preferably by following the optimal incoming branches stored in the optimal incoming branch memory 404. The reliability parameter 118 according to the third embodiment is then derived according to $$\Lambda_{path}^{traceback}=\sum_{k=0}^{K-1}\sum_{j=0}^{2}d_k^{(j)(received)}\cdot\left(1-2b_k^{(j)(re-encoded)}\right).$$

In a particularly beneficial embodiment for deriving the reliability parameter 118 (consistent with the third embodiment), the computation is implemented in two separate computations according to the decomposition $$\Lambda_{path}^{traceback}=\Lambda_{path,c}^{traceback}-\Lambda_{path,e}^{traceback},$$

wherein a correct-path sum is derived according to:

$$\Lambda_{path,c}^{traceback} = \sum_{k=0}^{K-1} \sum_{j=0}^{2} |d_k^{(j)(received)}| \cdot \text{boolean}((1 - 2b_k^{(j)(re-encoded)} = \text{sign}(d_k^{(j)(received)})),$$

and an error-bit path sum is derived according to:

$$\Lambda_{path,e}^{traceback} = \sum_{k=0}^{K-1} \sum_{j=0}^{2} |d_k^{(j)(received)}| \cdot \text{boolean}((1 - 2b_k^{(j)(re-encoded)} \neq \text{sign}(d_k^{(j)(received)})).$$

Each of the previous embodiments is extended to provide a reference value Γ denoted by 122, which is computed as the absolute sum of all soft bits of the soft bit representation of the received signal:

$$\Gamma = \sum_{k=0}^{K-1} \sum_{j=0}^{2} |d_k^{(j)(received)}| \geq \Lambda_{path}^{traceback}.$$

In a particularly beneficial embodiment of computing the reference value Γ, nested summation above is avoided by computing the reference value Γ according to:

$$\Gamma = \Lambda_{path,c}^{traceback} + \Lambda_{path,e}^{traceback}.$$

An invertible relation between the reliability parameter 118 (comprehensively denoted by $\Lambda_{path}$ for all embodiments of the reliability parameter 118) and the reference value Γ, on the one hand, and the correct-bit path sum $\Lambda_{path,c}$ and the error-bit sum $\Lambda_{path,e}$, on the other hand, is applicable to any one of the embodiments according to:

$$\begin{bmatrix} \Lambda_{path} \\ \Gamma \end{bmatrix} = \begin{bmatrix} +1 & -1 \\ +1 & +1 \end{bmatrix} \circ \begin{bmatrix} \Lambda_{path,c} \\ \Lambda_{path,e} \end{bmatrix},$$

or also $$\begin{bmatrix} \Lambda_{path,c} \\ \Lambda_{path,e} \end{bmatrix} = \frac{1}{2} \begin{bmatrix} +1 & +1 \\ -1 & +1 \end{bmatrix} \circ \begin{bmatrix} \Lambda_{path} \\ \Gamma \end{bmatrix}.$$

Above relation is bijective and has a geometric interpretation in terms two coordinate systems ($\Lambda_{path}$, Γ) and ($\Lambda_{path,c}$, $\Lambda_{path,e}$), the coordinate systems being rotated by 45° with respect to another. The above relation can be in any one of the afore-mentioned embodiments in order to derive missing values (out of $\Lambda_{path}$, Γ, $\Lambda_{path,c}$, and $\Lambda_{path,e}$).

The decoder 108 or the processor 110 further derives a second reliability parameter 120 (collectively denoted by R) as a function of the derived reliability parameter $\Lambda_{path}$ and the reference value Γ. The reliability parameter 118 is an absolute reliability measure. Choosing any homogeneous function f of degree zero depending on both $\Lambda_{path}$ and Γ, the second reliability parameter R=f($\Lambda_{path}$, Γ) provides a relative reliability measure, which is preferred for deciding upon further processing of the received or decoded signal.

A first embodiment of the second reliability parameter 120 is $$R_1 = \Lambda_{path}/\Gamma, \text{ with } 0 \leq R_1 \leq 1.$$

The first embodiment of the second reliability parameter 120 can be interpreted as a normalized fraction of soft bit values that are co-linear with the decided tail-bite code word according to the Viterbi decoding (or at least the Viterbi path). The first embodiment $R_1$ of the second reliability parameter 120 thus represents the "soft bit coherency". If the second reliability parameter 120 indicates poor signal quality or decoding quality (e.g. $R_1 < 0.75$, preferably $R_1 < 0.5$), the code word decision of the Viterbi decoding is unreliable, since there is a large number of sign errors in the soft bit values $d_k^{(j)(received)}$ as compared to the physical bits $b_k^{(j)(re-encoded)}$ according to the re-encoded code word decision. If the second reliability parameter 120 would equal one (which would be an ideal limiting case), all soft bit values $d_k^{(j)(received)}$ would have the correct sign, and such a code word decision of the Viterbi decoding could be judged as very reliable.

A second embodiment of the second reliability parameter 120 derives the second reliability parameter 120 by computing the ratio of error-bit path sum to the absolute sum of all received soft bit values:

$$R_2 = \frac{\Gamma - \Lambda_{path}}{2\Gamma} = \frac{\Lambda_{path,e}}{\Lambda_{path,c} + \Lambda_{path,e}}.$$

The second embodiment can be interpreted as an error rate for soft bits.

A third embodiment of the second reliability parameter 120 derives the second reliability parameter 120 by computing the ratio of error-bit path sum to the correct-bit path sum:

$$R_3 = \frac{\Gamma - \Lambda_{path}}{\Gamma + \Lambda_{path}} = \frac{\Lambda_{path,e}}{\Lambda_{path,c}}.$$

The advantage of the second reliability parameter 120 is its increased robustness and invariance. The second reliability parameter 120 is independent of a signal-to-noise ratio, bit length K, an absolute power control of the node 102 for control information addressed to individual user terminals 104, or channels characteristics, like frequency-selective fading. Such channel characteristics can be extracted from channel coefficients and serve as a third reliability parameter, or can be combined with one of the reliability parameters 118, 120.

A further advantage of the second reliability parameter 120 in general as compared to bit-error measures (such as an Hamming distance) is that puncturing (for rate matching) does not influence the second reliability parameter 120. Conventional bit-error measures count zero-filling bits at a puncturing position as possible bit-errors, which cause a systematic error floor in the conventional bit-error measures. Puncturing is particularly present in high-rate control data at low levels of aggregation.

Figure 5:
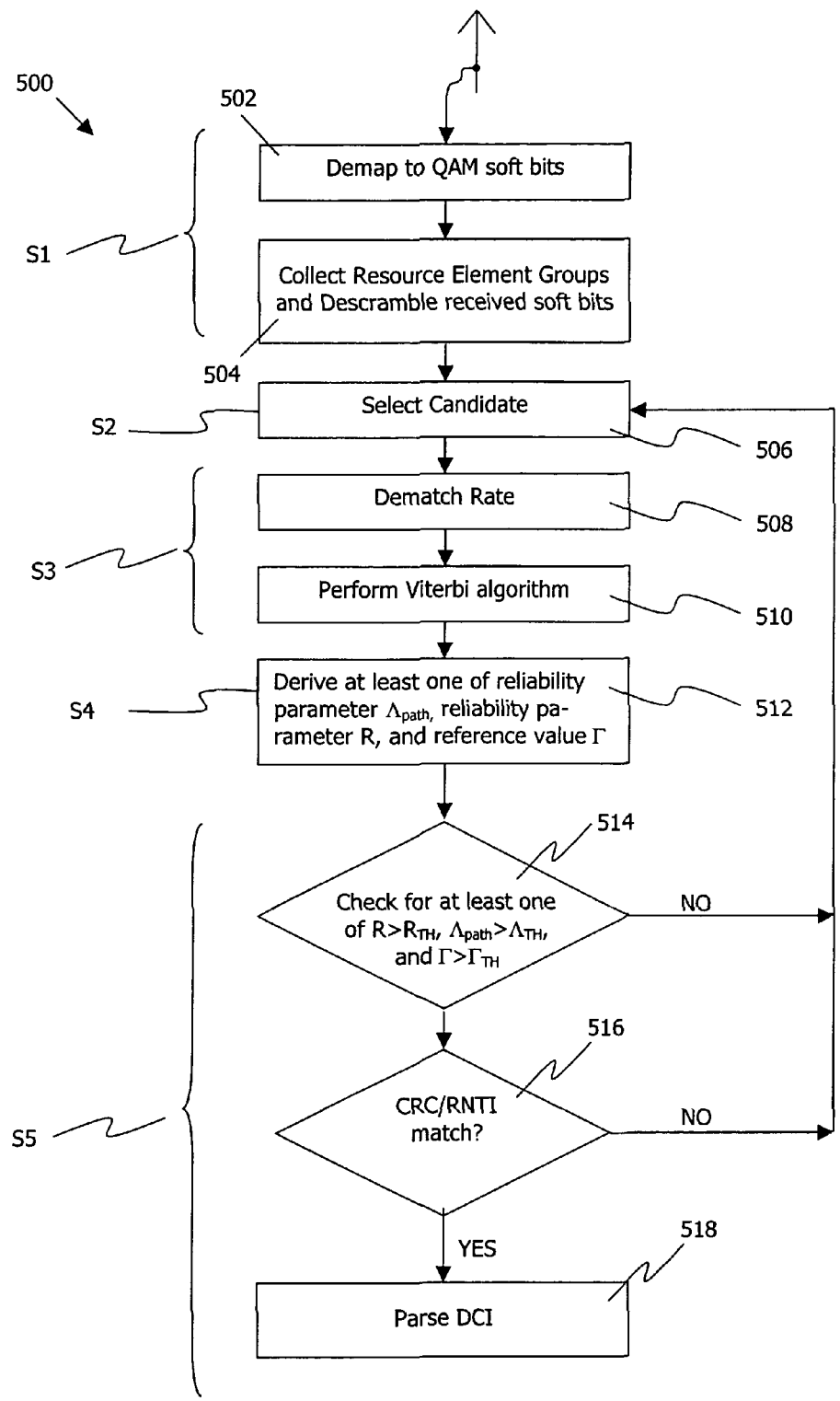
FIG. 5 is a schematic flow chart illustrating a first method embodiment for processing information in a mobile communication network.

FIG. 5 shows a flow chart of a first method embodiment of processing information in the mobile communication network 100 of FIG. 1. Generally, the method comprises a step S1 of receiving a signal encoded with a convolutional code, a step S2 of selecting a candidate code block 302, a step S3 of decoding the encoded signal using a Viterbi algorithm, a step S4 of deriving at least one of the reliability parameter 118 (in accordance with any one of the embodiments for $\Lambda_{path}$ described above), the reference value Γ denoted by 122, and the second reliability parameter 120 (in accordance with any one of the embodiments for R described above), and a step S5 of selectively processing information included in the received signal.

In more detail, step S1 comprises a step 502 of demapping a soft OFDM symbol representing the received OFDM signal after Fourier transformation (FFT) and, optionally, combining of two or more receive paths according to the channel coefficients. The soft OFDM symbol is demapped to QAM soft bits. The step S1 further comprises a step 504 of collecting Resource Element Groups (REGs) out of the OFDM symbol. The REGs belong to a control region of a downlink subframe. The resource elements collected in the REGs are assigned to a Physical Downlink Control Channel (PDCCH, see channel 306 in FIG. 1) within the downlink subframe. The received soft bits are also descrambled in step 504. Candidates for the code block 302 are selected in step 506 (step S2) out of the REGs.

Step S3 comprises a step 508 of rate de-matching, which is the reverse operation to rate matching in the node 102. At locations of punctured bits, zero values are inserted in the step 508. The step S3 further comprises the step of performing the Viterbi algorithm in step 510 (which may be limited to performing one or more updating process of the Viterbi algorithm, if the trace-back process is not yet required). In a step 512, one or both of the reliability parameters 118, 120 are derived based on the Viterbi state metric of the updating process in step 510 or based on an independent computation of the path metric in step 512.

In a step 514, it is decided based on at least one of the reliability parameters 118, the second reliability parameters 120, and the reference value 122, whether the candidate selected in step 506 should be further processed. In the case of a negative decision, the method proceeds in step 506 by selecting a further candidate or selecting a new candidate out of a further received signal.

In the case of a positive decision, the method proceeds with a step 516 by extracting the Cyclic Redundancy Check (CRC) value out of the check value 204 using the radio network temporary identifier of the user terminal 104. In case the CRC does not verify the downlink control information 202, a further candidate is selected in step 506. In case the cyclic redundancy check confirms the received downlink control information 202, the downlink control information is parsed in a step 518.

The logical or temporal order of steps 514 and 516 may be interchanged. Particularly, steps 514 and 516 can be parallelized.

Figure 6:
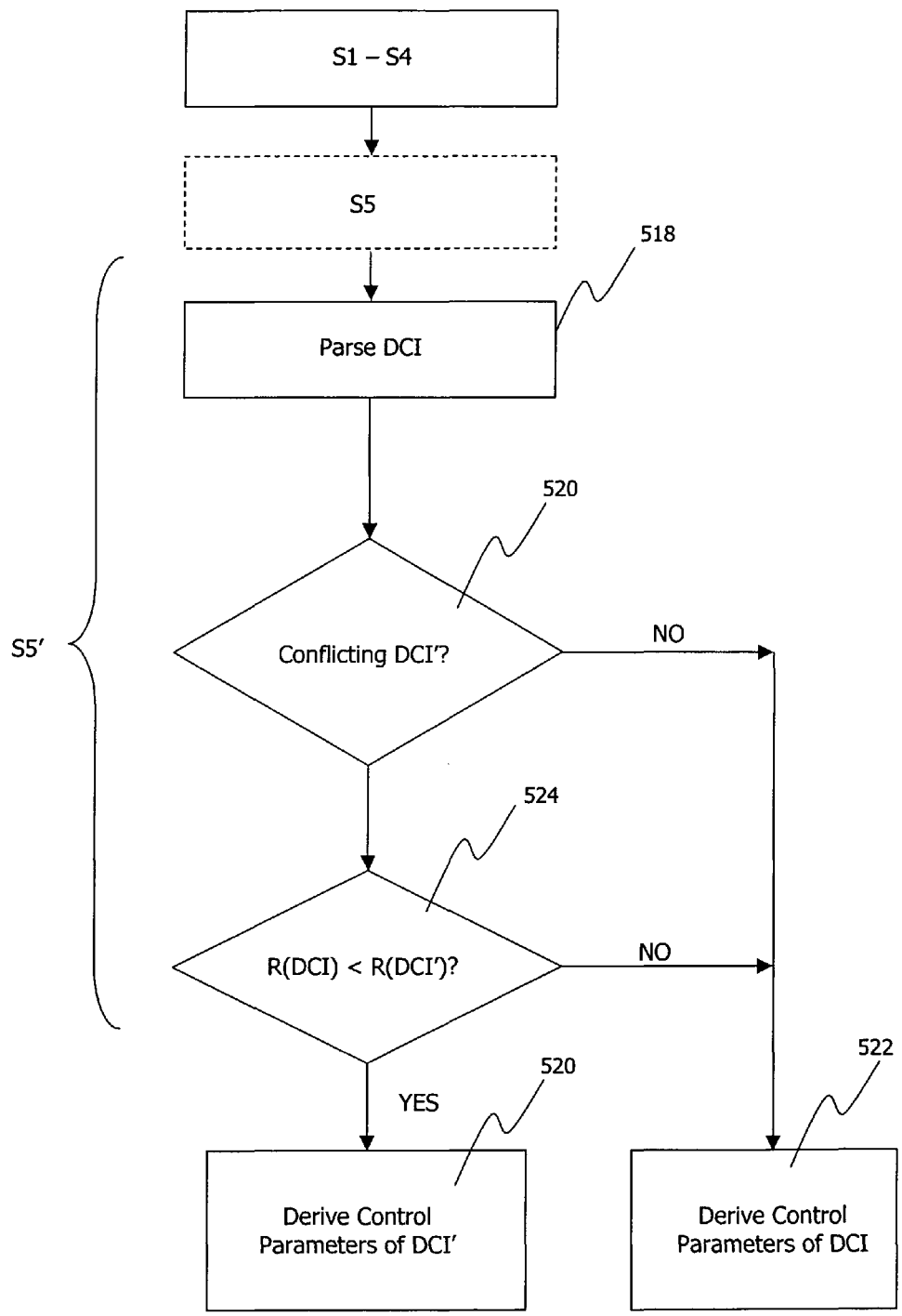
FIG. 6 is a schematic flow chart illustrating a second method embodiment combinable with the first method embodiment.

FIG. 6 shows a second method embodiment of processing information in the communication network 100 of FIG. 1. The second method embodiment comprises the steps S1 to S4 of the first method embodiment, and at least step 516 (of matching CRC/RNTI) out of step S5 of the first method embodiment. The second method embodiment continues after step 516 by parsing the downlink control information in step 518 and determining whether there is a (previous) downlink control information (DCI') in a step 520 for the same purpose as the downlink control information (DCI) parsed in step 518. In the absence of a conflicting DCI', control parameters are derived from the DCI in a step 522.

In case a conflicting DCI is found, in a step 524 at least one of the reliability parameters 118, the second reliability parameter 120, and the reference value 122 is a numerical criterion for deciding which downlink control information is to be applied by comparing respective reliability parameters for DCI and DCI'. The second reliability parameter 120 (R(DCI) and R(DCI), respectively) is preferred for its numerical invariance. If the (second) reliability parameter for the recent downlink control information DCI is higher as compared to the (second) reliability parameter of the previous downlink control information DCI', control parameters are derived from DCI in the step 522. Otherwise, the previous control information DCI' is applied in a step 526.

Effective error detection as early as possible in a processing chain is of particular benefit in the context of the LTE standard, which applies tail-biting convolutional codes for the physical downlink control channel (PDCCH) and a physical broadcast channel (PBCH) at frequencies as high as one subframe every millisecond. The user terminal 104 thus has to perform a large number of blind decodes within a search space of potential locations for control data, which leads to a non-negligible probability for processing harmful incorrect control data. Applying the measure 118, 120, or 122, preferably by comparison against a threshold value $\Lambda_{threshold}$, $R_{threshold}$, and $\Gamma_{threshold}$, respectively (according to step 514), eliminates the harmful incorrect control data caused by false alarms before entering the processing chain.

As has become apparent from the above embodiments, the technique presented herein provides various advantages. First of all, the technique provides a robust (absolute and relative) reliability parameter for the entire transport block 200, which can be independent of one or more of an instantaneous signal-to-noise ratio, the absolute power control or bit length K of different control data, channel conditions, and a code rate. A minor dependency on a transport block size can be quantified and compensated. Specifically for the LTE standard the technique can improve the decoding, increase physical layer robustness, increase the data throughput, and a user experience on an application layer.

In the foregoing, principles, embodiments and various modes of implementing the technique disclosed herein have exemplarily been described. The present invention should not be construed as being limited to the particular principles, embodiments and modes discussed above. Rather, it will be appreciated that variations and modifications may be made by a person skilled in the art without departing from the scope of the present invention as defined in the following claims.

The invention claimed is:

1. A method of processing information in a wireless communication network, the method comprising:
   receiving a signal encoded with a convolutional code, wherein the encoded signal comprises information and a check value and wherein the received signal is represented by soft bits;
   decoding the encoded signal using a Viterbi algorithm to derive the information and the check value, wherein the decoding includes computing a Viterbi state metric ($\Lambda$);
   deriving a reliability parameter based on the Viterbi state metric ($\Lambda$), wherein the reliability parameter is a Viterbi path metric;
   deriving a reference value ($\Gamma$) based on the signal, wherein the reference value ($\Gamma$) is determined by summation of absolute values of the soft bits;
   deriving a second reliability parameter (R) as a function of the derived reliability parameter and the reference value ($\Gamma$), wherein the second reliability parameter (R) is a homogeneous function of degree zero; and
   selectively processing the information depending on the check value, the second reliability parameter (R), and the reference value ($\Gamma$), wherein the information is discarded if the second reliability parameter fails to fulfil a predefined reliability criterion ($R_{TH}$).

2. The method of claim 1, wherein selectively processing of the information comprises discarding the information when the reliability parameter fails to fulfil a predefined reliability criterion ($\Lambda_{TH}$) and the reference value ($\Gamma$) is smaller than a predefined reference threshold ($\Gamma_{TH}$).

3. The method of claim 1, wherein the check value is at least one of a check sum value, a hash function value, and a cyclic redundancy check (CRC) value.

4. The method of claim 1, wherein the information comprises control information.

5. The method of claim 1, wherein the encoded signal comprises a user terminal identifier and the information is processed further depending on the user terminal identifier.

6. The method of claim 1, wherein the reliability parameter further depends on channel conditions of a transmission channel for the encoded signal.

7. The method of claim 1, wherein the Viterbi state metric ($\Lambda$) is computed for a final position of the received signal and the reliability parameter depends on a maximum of the Viterbi state metric ($\Lambda$) of the final position.

8. The method of claim 1, wherein the convolutional code is a tail-biting convolutional code and the computation of the Viterbi state metric ($\Lambda$) is repeated, the repeated computation being initialized by a Viterbi state metric ($\Lambda$) previously computed for a final position of the received signal.

9. The method of claim 8, wherein the Viterbi state metric ($\Lambda$) previously computed for the final position is stored and the reliability parameter depends on a maximum of the difference between the Viterbi state metric ($\Lambda$) of the repeated computation for the final position and the stored Viterbi state metric ($\Lambda$).

10. The method of claim 1, wherein the reliability parameter is computed by a summation including the soft bits.

11. The method of claim 10, wherein the summation including the soft bits further includes signs determined during a trace-back of the decoding.

12. The method of claim 1, wherein the function (R) is one of a first quotient $$R_1 = \Lambda_{path}^x / \Gamma,$$

a second quotient $$R_2 = (\Gamma - \Lambda_{path}^x)/(2\Gamma),$$

a third quotient $$R_3 = (\Gamma - \Lambda_{path}^x)/(\Gamma + \Lambda_{path}^x),$$

and any function thereof, wherein $\Lambda_{path}^x$ is the Viterbi path metric.

13. A computer program product stored in a non-transitory computer readable medium for processing information in a wireless communication network, the computer program product comprising software instructions which, when run on one or more computing devices, causes the devices to:
receive a signal encoded with a convolutional code, wherein the encoded signal comprises information and a check value and wherein the received signal is represented by soft bits;
decode the encoded signal using a Viterbi algorithm to derive the information and the check value, wherein the decoding includes computing a Viterbi state metric ($\Lambda$);
derive a reliability parameter based on the Viterbi state metric ($\Lambda$), wherein the reliability parameter is a Viterbi path metric;
derive a reference value ($\Gamma$) based on the signal, wherein the reference value ($\Gamma$) is determined by summation of absolute values of the soft bits;
derive a second reliability parameter (R) as a function of the derived reliability parameter and the reference value ($\Gamma$), wherein the second reliability parameter (R) is a homogeneous function of degree zero; and
selectively process the information depending on the check value, the second reliability parameter (R), and the reference value ($\Gamma$), wherein the information is discarded if the second reliability parameter fails to fulfil a predefined reliability criterion.

14. A device for processing information in a wireless communication network, the device comprising:
a receiver adapted to receive a signal encoded with an convolutional code, wherein the encoded signal comprises information and a check value, wherein the receiver is adapted to provide soft bits representative of the received signal;
a decoder adapted to decode the encoded signal using a Viterbi algorithm to derive the information and the check value, wherein the decoding includes computing a Viterbi state metric ($\Lambda$);
a processor adapted to derive a reliability parameter based on the Viterbi state metric ($\Lambda$), wherein the reliability parameter is a Viterbi path metric, to derive a reference value ($\Gamma$) based on the signal, wherein the reference value ($\Gamma$) is determined by summation of absolute values of the soft bits, to derive a second reliability parameter (R) as a function of the derived reliability parameter and the reference value ($\Gamma$), wherein the second reliability parameter (R) is a homogeneous function of degree zero, and to selectively process the information depending on the check value, the second reliability parameter (R), and the reference value ($\Gamma$), wherein the information is discarded if the second reliability parameter fails to fulfil a predefined reliability criterion.

15. The device of claim 14, wherein the decoder is adapted to compute the Viterbi state metric ($\Lambda$) for a final position of the received signal, and wherein the processor is adapted to derive the reliability parameter depending on a maximum of the Viterbi state metric ($\Lambda$) of the final position.

* * * * *